(12) United States Patent
Posner et al.

(10) Patent No.: US 9,480,155 B2
(45) Date of Patent: Oct. 25, 2016

(54) FLEXIBLE CABLES IN ELECTRONIC DEVICES WITH MOVING COMPONENTS

(71) Applicant: Apple Inc., Cupertino, CA (US)

(72) Inventors: Bryan W. Posner, La Selva, CA (US); Christiaan A. Ligtenberg, San Carlos, CA (US); Dinesh C. Mathew, Fremont, CA (US); Eric L. Benson, San Francisco, CA (US); Robert Y. Cao, San Francisco, CA (US); Valerie S. Chang, Cupertino, CA (US); Victor H. Yin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 183 days.

(21) Appl. No.: 14/328,565

(22) Filed: Jul. 10, 2014

(65) Prior Publication Data

US 2016/0014915 A1    Jan. 14, 2016

(51) Int. Cl.
  *H05K 1/09* (2006.01)
  *H05K 1/03* (2006.01)
  *G06F 1/16* (2006.01)

(52) U.S. Cl.
  CPC .............. *H05K 1/09* (2013.01); *G06F 1/1616* (2013.01); *G06F 1/1683* (2013.01); *H05K 1/03* (2013.01)

(58) Field of Classification Search
  CPC ......... H05K 5/0226; H05K 1/03; H05K 1/09
  See application file for complete search history.

(56) References Cited

U.S. PATENT DOCUMENTS

| | | |
|---|---|---|
| 6,221,176 B1 | 4/2001 | Merchant et al. |
| 6,372,996 B2* | 4/2002 | Lin ........................ 174/117 FF |
| 7,377,034 B2* | 5/2008 | Thomason ............ G06F 1/1616 174/254 |
| 8,222,365 B2 | 7/2012 | Shimeno et al. |
| 8,419,918 B2 | 4/2013 | Hong et al. |
| 2003/0133277 A1* | 7/2003 | Saijo .................... H05K 1/0221 361/774 |
| 2013/0249740 A1 | 9/2013 | Shedletsky |

FOREIGN PATENT DOCUMENTS

| | | |
|---|---|---|
| EP | 2679384 A1 | 1/2014 |
| WO | 2006059825 A1 | 6/2006 |

OTHER PUBLICATIONS

Qian et al., U.S. Appl. No. 13/908,280, filed Jun. 3, 2013.

* cited by examiner

*Primary Examiner* — Jeremy C Norris
(74) *Attorney, Agent, or Firm* — Treyz Law Group, P.C.; G. Victor Treyz; Joseph F. Guihan

(57) ABSTRACT

An electronic device may have a housing. Electrical components such as a display and other circuitry may be mounted in the housing. The housing may have portions that move with respect to each other such as a lid that rotates relative to a base. A flexible printed circuit may have metal lines that couple components in one portion of the housing to components in another portion of the housing. As the housing portions move with respect to each other, the flexible printed circuit bends. Reliability may be enhanced for the flexible printed circuit by providing the metal layer that forms the metal lines with upper and lower coating layers. The coating layers may be formed from metal with a higher Young's modulus than a metal core in the metal layer. A slot may be formed along the length of the flexible printed circuit to help increase the minimum bend radius exhibited by the flexible printed circuit. Upper and lower metal shield layers may be provided above and below the metal traces.

19 Claims, 11 Drawing Sheets

FLEXIBLE CABLES IN ELECTRONIC DEVICES WITH MOVING COMPONENTS

BACKGROUND

This relates generally to electronic devices, and more particularly, to electronic devices containing electrical components that move with respect to each other.

Electronic devices such as portable computers have displays for displaying images for a user. In a typical configuration, a portable computer has a housing that includes a lid and a base that are attached to each other by a hinge. A keyboard is mounted in the base. The display of the portable computer is mounted in the lid.

There can be challenges involved in conveying signals between moving components in an electronic device. For example, it can be difficult to effectively couple circuitry in the base of a portable computer and the display in the lid. Some computers use a bulky wiring harness that includes a coaxial cable. Other computers use a flexible printed circuit cable that is wrapped in a spiral shape. Configurations such as these may allow rotation of the lid relative to the base, but can require bulky hinge structures to provide sufficient space to accommodate the wiring harness or spiral flexible printed circuit. If care is not taken, signal lines that extend between the base and lid through a hinge may become weakened due to movement of the hinge.

It would therefore be desirable to provide improved ways in which to couple circuitry between parts of an electronic device that move relative to each other such as the base and lid of a portable computer.

SUMMARY

An electronic device may have a housing. Electrical components such as a display and other components may be mounted in the housing. The housing may have portions that move with respect to each other such as a lid that rotates relative to a base. A flexible printed circuit may have metal lines that couple components in one portion of the housing to components in another portion of the housing. As the housing portions move with respect to each other, the flexible printed circuit bends.

The metal lines of the flexible printed circuit may be formed from a patterned metal layer on a polymer substrate. A coverlay may cover the metal layer. Upper and lower metal shielding layers may be provided above the coverlay and below the polymer substrate, respectively. Slots in the coverlay may be aligned with ground lines in the metal lines to short the upper metal shielding layer to the ground lines.

The metal layer of the flexible printed circuit may be formed from a core layer having upper and lower surfaces. Coating layers may be formed on the upper and lower surfaces. The core layer may be characterized by a Young's modulus. The coating layers may be formed from metals that exhibit a Young's modulus that is greater than the Young's modulus of the core layer. This helps prevent the initiation of stress-induced cracking in the core layer when the flexible printed circuit bends. Reliability may also be enhance by forming a slot along the length of the flexible printed circuit to help increase the minimum bend radius exhibited by the flexible printed circuit when the flexible printed circuit is bent.

Further features of the invention, its nature and various advantages will be more apparent from the accompanying drawings and the following detailed description of the preferred embodiments.

DETAILED DESCRIPTION

Electronic devices may have housing structures or other parts containing electrical components that move with respect to each other. The electrical components may be electrically coupled to each other using a cable. The cable may be formed from a flexible printed circuit. The components that are interconnected in this way may be input-output components such as displays, keyboards, and track pads, may be audio components, may be integrated circuits mounted on a printed circuit substrate, or may be other components. Illustrative devices with moving parts such as portable computers and other devices with displays are sometimes described herein as an example. This is, however, merely illustrative. Any suitable electronic device with portions that move relative to each other may contain a flexible printed circuit cable, if desired.

Figure 1:
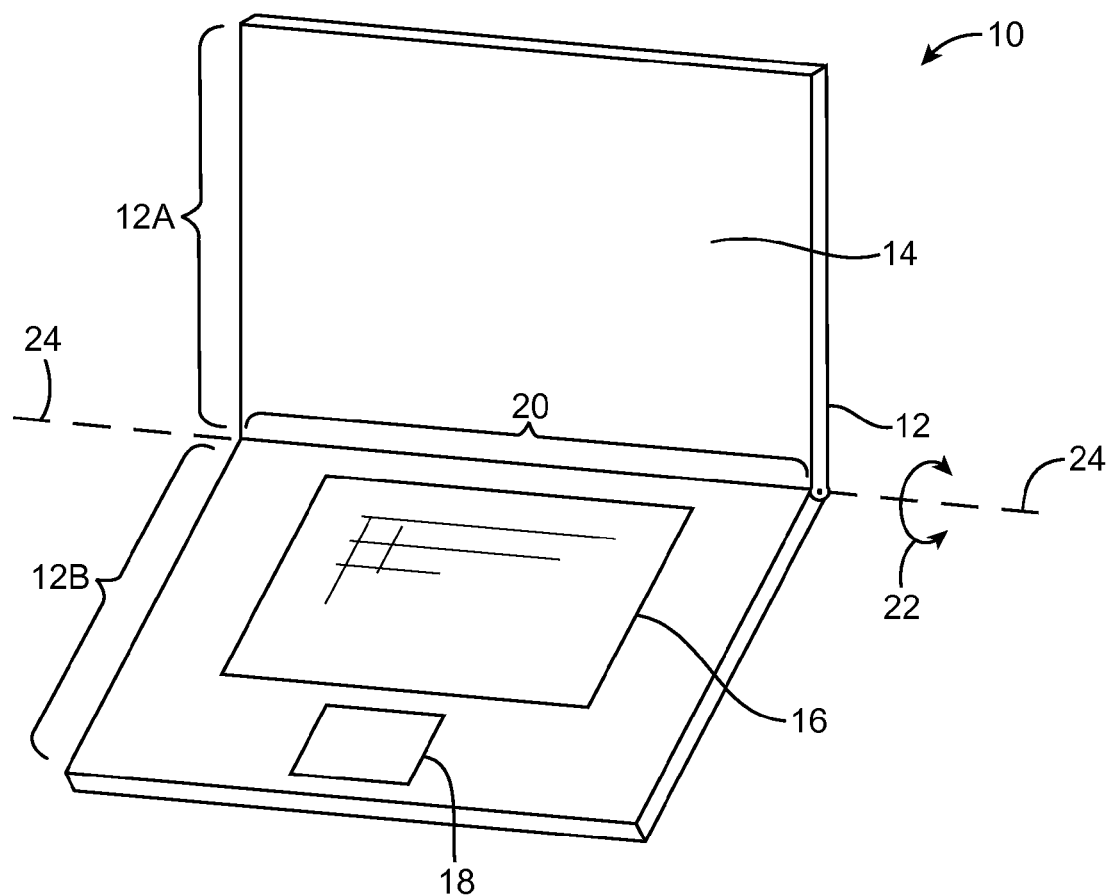
FIG. 1 is a perspective view of an illustrative electronic device such as a laptop computer of the type that may be provided with a conductive path to couple circuitry in a housing base to circuitry in a housing lid in accordance with an embodiment.

An electronic device of the type that may be provided with a display and a flexible printed circuit cable coupled to the display is shown in FIG. 1. As shown in FIG. 1, electronic device 10 may have portions that move relative to each other such as upper housing 12A and lower housing 12B. Lower housing 12B may sometimes be referred to as a main housing, base housing, or base. Upper housing 12A may sometimes be referred to as a lid or display housing.

Electronic device 10 of FIG. 1 may be a portable computer or other electronic device that has a folding lid or may be other electronic equipment. Device 10 may have two housing structures or other portions that move relative to each other or may have three or more moving structures. In the illustrative configuration of FIG. 1, device 10 has a first portion (upper housing 12A) that moves relative to a second portion (lower housing 12B), but additional portions of device 10 may move relative to the first and second portions if desired.

As shown in FIG. 1, components such as keyboard 16 and touchpad 18 may be mounted on lower housing (base) 12B. Base 12B may also be used to house components such as a disk drive, audio components such as speakers, digital and analog signal ports, removable media slots, and other components. Device 10 may have hinge structures in region 20 that allow upper housing (lid) 12A to rotate in directions 22 about rotational axis 24 relative to base 12B. Display 14 may be mounted in lid 12A. Lid 12A may be placed in a closed position by rotating upper housing 12A towards lower housing 12B about rotational axis 24. Illustrative device 10 of FIG. 1 has housing structures that rotate relative to each other. In general, device 10 may have portions that rotate relative to each other, that laterally translate relative to each other, or that exhibit other types of relative movement.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components, organic light-emitting diode display components, electrophoretic display components, plasma display components, or other suitable display pixel structures. For example, display 14 may be a color liquid crystal display.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass sheet, a clear plastic layer, or other transparent member.

Figure 2:
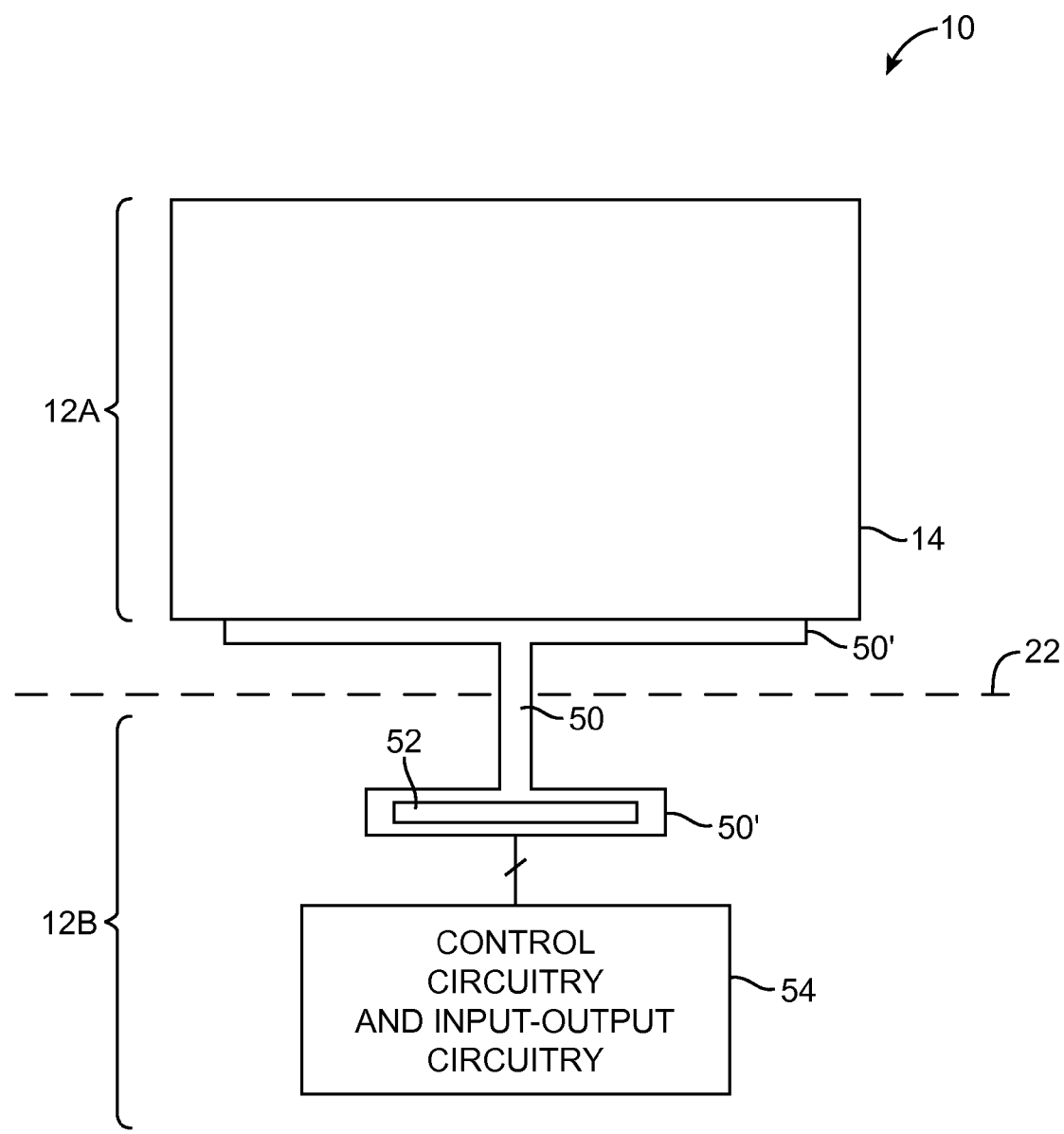
FIG. 2 is diagram showing how a flexible printed circuit cable may be used to couple circuits in different parts of an electronic device that move relative to each other in accordance with an embodiment.

A diagram of an illustrative configuration that may be used for coupling electrical components in moving parts of an electronic device such as upper housing 12A and lower housing 12B of electronic device 10 is shown in FIG. 2. As shown in FIG. 2, electronic device 10 may include control circuitry and input-output circuitry such as circuitry 54. Circuitry 54 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 54 may be used to control the operation of device 10. The processing circuitry may be based on one or more microprocessors, microcontrollers, digital signal processors, baseband processors, power management units, audio codec chips, application specific integrated circuits, etc. The storage and processing circuitry of circuitry 54 may be used to run software on device 10, such as internet browsing applications, voice-over-internet-protocol (VOIP) telephone call applications, email applications, media playback applications (e.g., applications that display moving and still images on display 14), operating system functions, etc. To support interactions with external equipment, circuitry 54 may be used in implementing communications protocols. Communications protocols that may be implemented using circuitry 54 include internet protocols, wireless local area network protocols (e.g., IEEE 802.11 protocols—sometimes referred to as WiFi®), protocols for other short-range wireless communications links such as the Bluetooth® protocol, cellular telephone protocols, etc. Circuitry 54 may include input-output circuitry. The input-output circuitry may be used to allow data to be supplied to device 10 and to allow data to be provided from device 10 to external devices. The input-output circuitry of circuitry 54 may include input-output devices such as touch screens, buttons, joysticks, scrolling wheels, touch pads, key pads, keyboards, light-emitting diodes and other status indicators, data ports, and audio components such as microphones and speakers. Circuitry 54 may also include sensors. For example, circuitry 54 may include an ambient light sensor, a proximity sensor, an accelerometer, and other sensor structures. Wireless communications circuitry and other communications circuitry in circuitry 54 may allow device 10 to communicate with external equipment.

Electrical components such as the components of circuitry 54 may be mounted in lower housing 12B and may therefore move relative to components mounted in upper housing 12A such as display 14. Display 14 may include an array of pixels. The pixels of display 14 may be, for example, liquid crystal display pixels formed on one or more display layers (e.g., polarizers, a color filter layer, a thin-film transistor layer, and a layer of liquid crystal material interposed between the color filter layer and the thin-film transistor layer, and other display layers).

Display circuitry such as a timing controller integrated circuit, gate driver circuitry, and column driver integrated circuits may be used in controlling the array of pixels in display 14 to present images on display 14 for a user of device 10. Column driver circuitry may provide data signals to data lines that run vertically through display 14. Gate driver circuitry may be used to assert a control signal on horizontal control lines. Some display driver circuitry may be formed from thin-film circuits on a thin-film transistor layer or other substrate in the display layers of display 14. Other display driver circuitry may be formed from integrated circuits and may be mounted in housing 12A (e.g., on a ledge portion of display 14 or on a substrate adjacent to display 14) and/or may be mounted in housing 12B (e.g., on a printed circuit substrate).

A flexible printed circuit cable such as flexible printed circuit 50 may be used to join circuitry in upper housing 12A (e.g., display 14 and associated display driver circuits and/or other electrical components) with circuitry in lower housing 12B (e.g., display driver circuitry and/or other components and circuitry 54). The flexible printed circuit cable may have an elongated central portion that joins opposing end portions 50'. Components such as component 52 (e.g., circuitry such as circuitry 54, a timing controller integrated circuit, a board-to-board connector or other connectors, etc.) may be mounted on flexible printed circuit cable 50 (e.g. on one or both of ends 50').

The cable of FIG. 2 may be a flexible printed circuit that contains no rigid printed circuit board portions or may be the type of flexible printed circuit that is sometimes referred to as "rigid flex" and that has rigid printed circuit board regions combined with flexible regions. With one illustrative arrangement, ends 50' of flexible printed circuit 50 may be rigid printed circuit board portions (e.g., printed circuits formed from layers of rigid printed circuit board material such as fiberglass-filled epoxy) and the central portion of flexible printed circuit 50 may be formed from a length of flexible printed circuit that does not contain rigid portions (e.g., a flexible printed circuit formed form a flexible polymer substrate such as polyimide). Other types of flexible printed circuit may be used in forming a cable that extends between moving housing structures 12A and 12B if desired. The use of an arrangement in which a cable is formed from flexible printed circuit material having ends 50' that are rigid may sometimes be described herein as an example.

Figure 3:
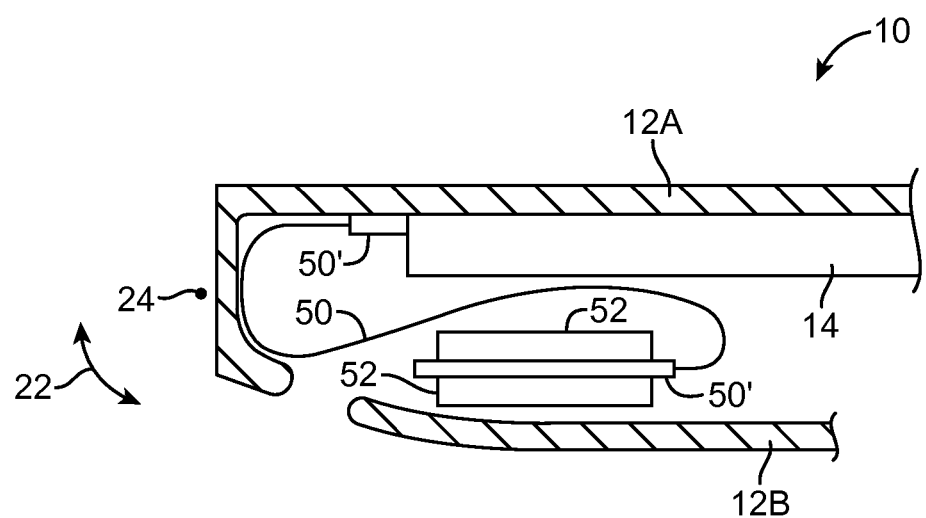
FIG. 3 is a cross-sectional end view of a hinge portion of a portable computer in a closed position showing how a flexible printed circuit can be used to route signals circuitry in a base of the portable computer and a display or other circuitry in a lid of the portable computer in accordance with an embodiment.
Figure 4:
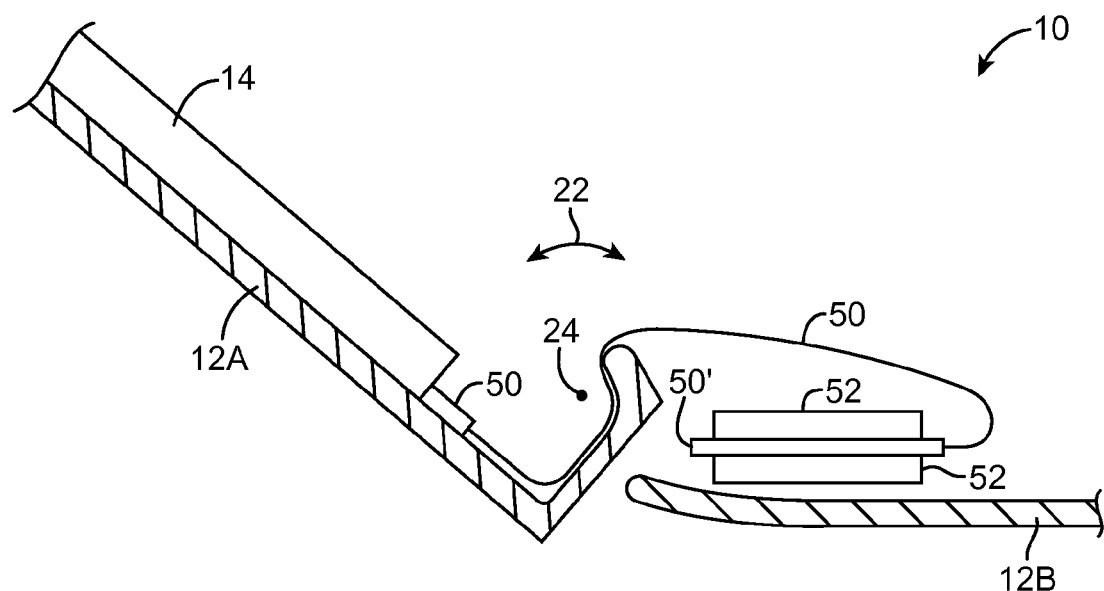
FIG. 4 is a cross-sectional end view of the hinge portion of the portable computer of FIG. 3 in an open position in accordance with an embodiment.

As shown in FIG. 2, flexible printed circuit 50 may overlap rotational axis 22. This may cause flexible printed circuit 50 to flex back and forth during opening and closing of lid 12A, as shown by comparing the position of flexible printed circuit 50 in FIG. 3 (a closed lid configuration for device 10) with the position of flexible printed circuit 50 in FIG. 4 (an open lid configuration for device 10). As shown in FIGS. 3 and 4, bends may be formed in multiple directions within flexible printed circuit 50 (e.g., to facilitate formation of a service loop). Features are preferably incorporated into flexible printed circuit 50 to ensure that flexible printed circuit 50 is able to reliably endure repeated bending.

Figure 5:
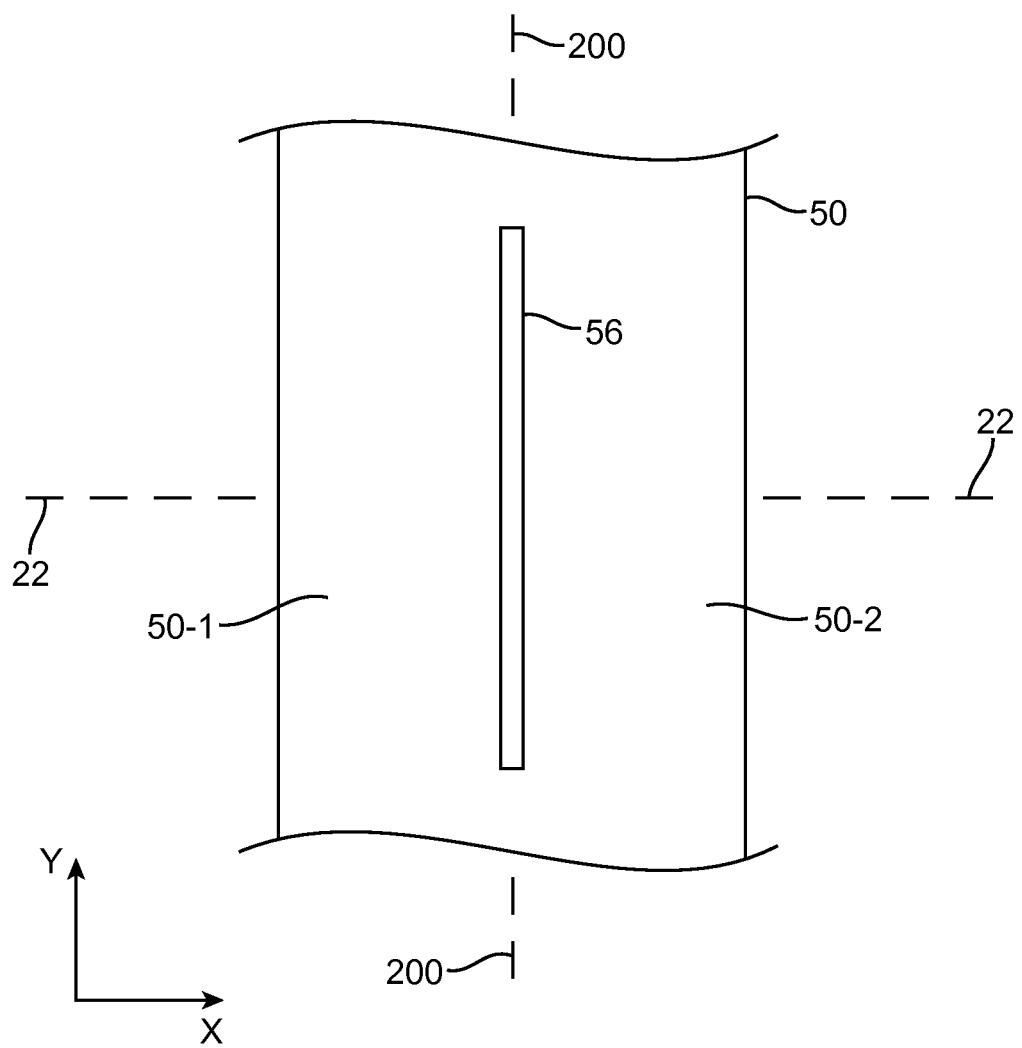
FIG. 5 is a top view of a portion of an illustrative flexible printed circuit with a slot that is located in the center of the flexible printed circuit and that runs along the length of the flexible printed circuit in accordance with an embodiment.

As shown in FIG. 5, flexible printed circuit 50 may have an elongated shape (e.g., a long thin rectangular shape or other shape) that extends along longitudinal axis 200 and that overlaps axis 22. The reliability of flexible printed circuit 50 can be affected by the minimum bend radius experienced by flexible printed circuit 50 during use (e.g., during flexing about axis 22). Larger bend radii are less stressful to flexible printed circuits than smaller bend radii. For example, the metal traces in a flexible printed circuit that experience only a large bend radius are less likely to experience cracking than the metal traces in a flexible printed circuit that experiences a small bend radius.

During installation, flexible printed circuit 50 may be subject to slight misaligned along lateral dimension X due to normal manufacturing variations. Flexible printed circuit preferably has one or more longitudinal slots such as slot 56 that extend along longitudinal axis 200. Slot 56, which may sometimes be referred to as a slit or elongated opening, preferably has an elongated shape (e.g., the aspect ratio or length to width ratio of slot 56 may be 5 or more 10 or more, 20 or more or 50 or more). Slot 56 penetrates through all of the layers of flexible printed circuit 50.

The presence of slot 56 helps provide flexible printed circuit 50 with the ability to accommodate lateral misalignment without exhibiting undesirably small bend radii. For example, left-hand portion 50-1 of flexible printed circuit 50 may move relative to right-hand portion 50-2 of flexible printed circuit, which can allow sufficient rearrangement of the structures in flexible printed circuit 50 to prevent excessively tight bending.

Figure 6:
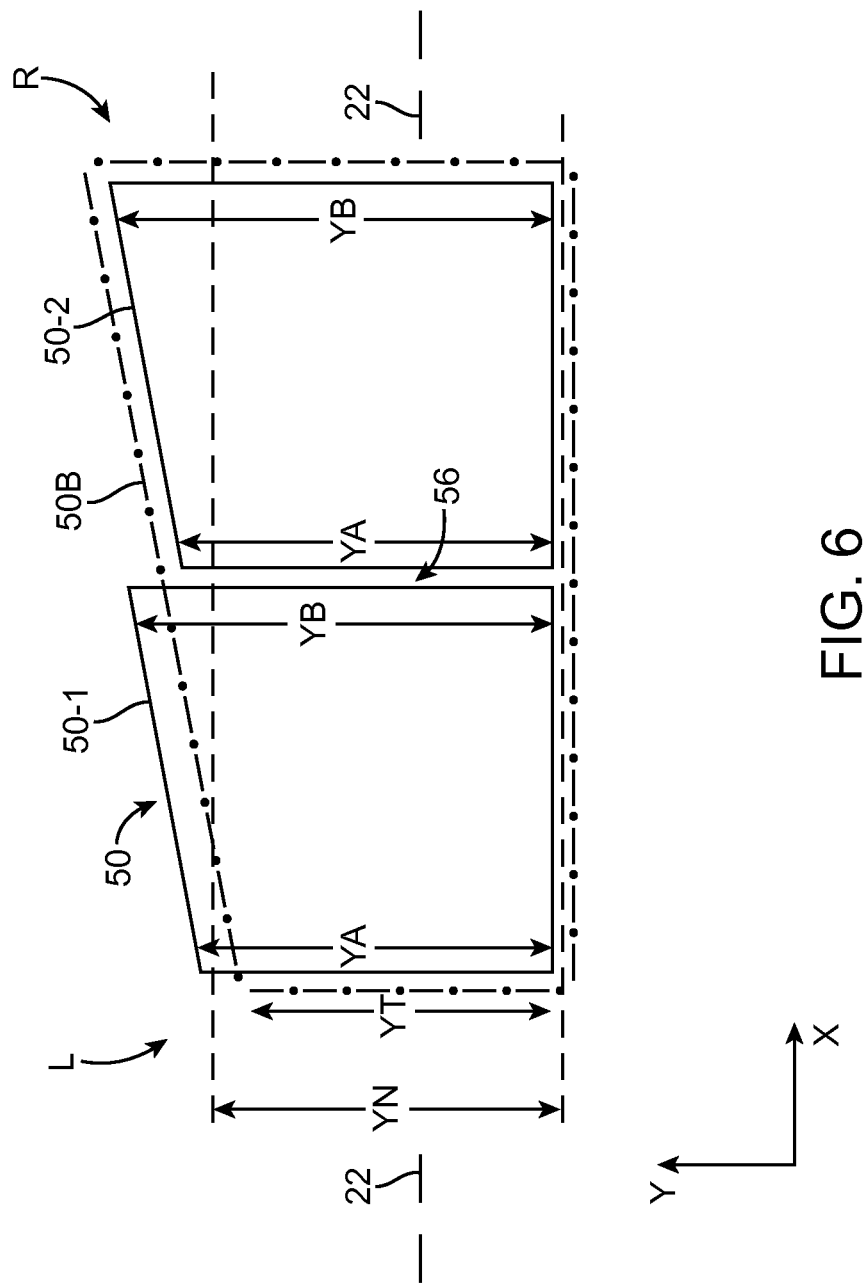
FIG. 6 is a diagram showing how a slot that runs along the length of a flexible printed circuit cable such as the cable of FIG. 5 may help to prevent formation of an overly small bend radius in the cable when in a bent configuration in accordance with an embodiment.

Consider, as an example, the situation in which a flexible printed circuit has been slightly misaligned along lateral dimension X. The diagram of FIG. 6 shows how the presence of slot 56 helps prevent flexible printed circuit 50 from experiencing an excessively small bend radius. In the example of FIG. 6, two different flexible printed circuits are shown in a curled configuration, bent around axis 22. Printed circuit 50B does not contain any slots. Printed circuit 50 contains slot 56, which separates left-hand portion 50-1 from right-hand portion 50-2. Due to the slight lateral misalignment of the flexible printed circuits along lateral dimension X, the left edges L of the printed circuits curls more tightly than the right edges R of the printed circuits. This raises the risk that the printed circuits will exhibit a bend radius along left edges L that is smaller than desired.

In the example of FIG. 6, the desired minimum bend radius for the flexible printed circuit is achieved when the flexible printed circuit extends vertically by no less than amount YN. As shown in FIG. 6, slotless flexible printed circuit 50B has a left edge that extends vertically by an amount YT that is less than YN (i.e., printed circuit 50B has a bend radius that is smaller than the minimum desired bend radius). In contrast, slot 56 allows portions 50-1 and 50-2 of flexible printed circuit 50 to move relative to each other so that the left edge of portion 50-1 (and the left edge of portion 50-2) extends vertically by an amount YA that is greater than YN. The right edges of portions 50-1 and 50-2 also extend vertically by a distance YB that is greater than YN. As this example demonstrates, the presence of slot 56 running along the length of flexible printed circuit 50 (the Y dimension of FIG. 6) allows the material of flexible printed circuit 50 to move sufficiently to prevent excessively small bend radii from developing, thereby enhancing the reliability of flexible printed circuit 50.

Flexible printed circuit 50 may also incorporate internal features that help enhance reliability. For example, the metal layer used in forming metal traces for ground signals and data signals in flexible printed circuit 50 may be provided with surface treatments that help the metal layer resist cracking.

Figure 7:
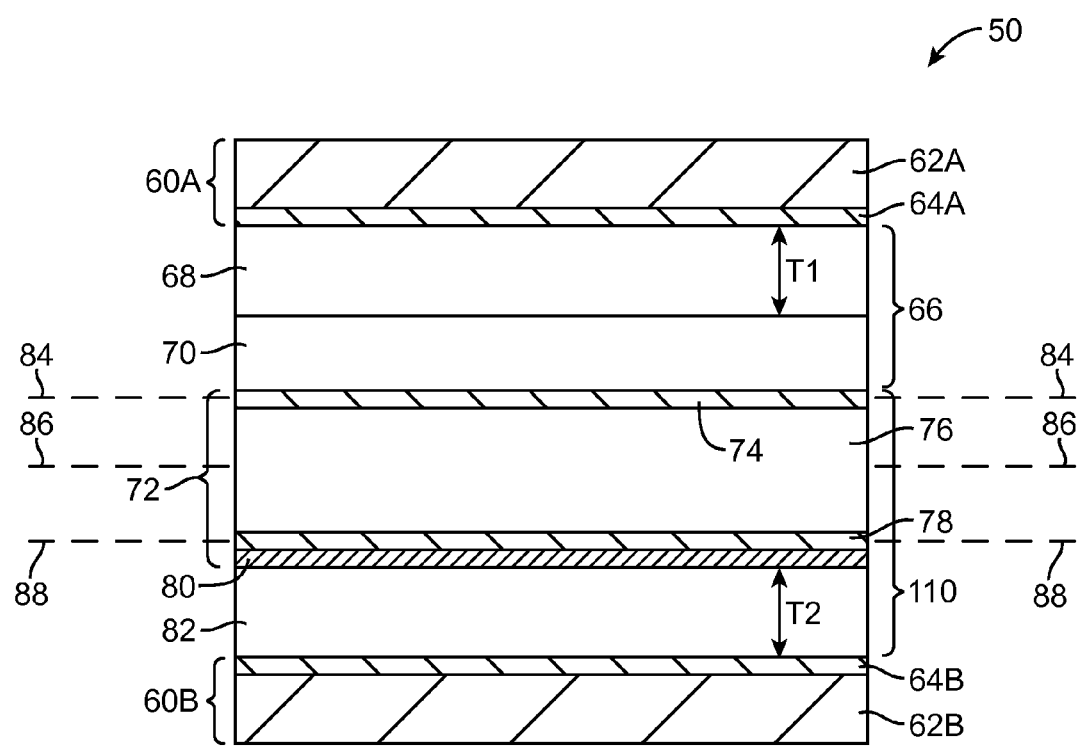
FIG. 7 is a cross-sectional side view of an illustrative flexible printed circuit of the type that may be used in interconnecting circuits in different parts of an electronic device that move relative to each other.

A cross-sectional side view of an illustrative configuration that may be used for flexible printed circuit 50 is shown in FIG. 7. When slot 56 of FIG. 5 is formed along the length of flexible printed circuit 50, slot 56 passes through all of the layers of FIG. 7.

As shown in FIG. 7, flexible printed circuit 50 may have a metal layer (sometimes referred to as a layer of metal traces) such as metal layer 72. Metal layer 72 may contain a core metal such as core metal layer 76. Core metal layer 76 may be formed from a metal with a high conductivity such as copper. Metal layer 72 may also have upper layer 74 and lower layer 78 formed on opposing upper and lower surfaces of core layer 76. Layers 74 and 78 may be coatings that are formed by treating the surfaces of core metal layer 76. The thicknesses of core layer 76 may be about 5-20 microns (e.g., 12 microns), less than 15 microns, or more than 8 microns (as examples). Coatings 74 and 78 may have thicknesses of 0.5 to 1.5 microns, more than 0.5 microns, less than 1.5 microns, less than 2 microns, or other suitable thickness.

The material that is used in forming coatings 74 and 76 may enhance the ability of metal layer 72 to resist cracking. For example, coatings 74 and 78 may have a Young's modulus that is greater than the Young's modulus of core metal layer 76. Core 76 may be formed from copper or other metals. Examples of materials that may be used in forming layers 74 and 78 when core 76 is formed from copper include nickel or a nickel alloy, cobalt or a cobalt alloy, or a mixture of nickel, cobalt, and copper. During fabrication, metal layer 72 may be patterned to form ground paths (sometimes referred to as ground lines) and signal paths (e.g., signal lines including analog and/or digital signal paths, sometimes referred to as data lines) in flexible printed circuit 50.

Dielectric layers may separate metal layer 72 from upper shield layer 60A and lower shield layer 60B. Upper shield layer 60A may have metal layer 62A and conductive adhesive layer 64A. Lower shield layer 60B may have metal layer 62B and conductive adhesive layer 64B. Metal layers 60A and 60B may be, for example, silver tape layers in which metal layers 62A and 62B are silver layers and layers 64A and 64B are formed from a conductive adhesive such as anisotropic conductive film.

Metal shield layers 60A and 60B may be grounded and may serve as electromagnetic shielding for flexible printed circuit 50. The thickness of metal layers 60A and 60B may be 8 microns, 5-10 microns, more than 5 microns, or less than 10 microns.

Metal layer 72 may be attached to polymer substrate 82 using adhesive layer 80 (e.g., a thin layer of epoxy having a thickness of less than 1 micron). Substrate 82 may be formed from a material such as polyimide. The thickness of polyimide substrate layer 82 may be 19 microns, 5-25 microns, more than 5 microns, more than 10 microns, less than 25 microns, or less than 15 microns. Metal trace layer 72 may be attached to substrate 82 before incorporating subsequent structures such as dielectric cover layer (coverlay) 66 and metal shields 60A and 60B into flexible printed circuit 50.

Coverlay 66 may include an adhesive layer such as a layer of pressure sensitive adhesive (e.g., adhesive layer 70) and may include a polymer layer such as polyimide layer 68. Polyimide layer 68 may have a thickness of 12.5 microns, 5-20 microns, more than 5 microns, more than 10 microns, less than 20 microns, or less than 15 microns. Adhesive layer 70 in coverlay 66 may have a thickness of 20 microns, 10-30 microns, more than 5 microns, more than 15 microns, less than 30 microns, or less than 25 microns.

The presence of surface treatment layers 74 and 78 on both the upper and lower surfaces of metal core layer 76 helps to prevent cracks from forming in core layer 76, even when layer 76 bends back and forth as housings 12A and 12B are rotated relative to each other. Conventional flexible copper cladding (FCCL) structures have a polyimide substrate with a copper layer that is treated on only one side to improve adhesion between the copper and polyimide and are therefore less able than flexible printed circuit 50 to resist cracks.

When flexible printed circuit 50 is bent, upper layers in flexible printed circuit 50 will experience compressive (or tensile) stress, whereas the lower layers in flexible printed circuit 50 will experience respective tensile (or compressive) stress. Accordingly, a neutral stress plane in which stress levels are minimized will lie somewhere within the layers of flexible printed circuit 50. If desired, the relative thicknesses of the layers of flexible printed circuit 50 may be adjusted to align the neutral stress plane of flexible printed circuit 50 with an appropriate portion of metal layer 72. As an example, the relative thicknesses T1 and T2 of polyimide layers 68 and 82 (e.g., the thickness of coverlay 66 versus the thickness of substrate 82) may be adjusted to place the neutral stress plane in a desired location.

Locations at which the neutral stress plane may be located to enhance the reliability of flexible printed circuit 50 are illustrated by neutral stress plane 84 (which is shown as being aligned with upper metal coating 74), neutral stress plane 86 (which is shown as being aligned with core layer 76), and neutral stress plane 88 (which is shown as being aligned with lower metal coating 74). These neutral stress plane locations can help prevent cracks from forming in metal layer 72 that might damage layer 72.

Figure 8:
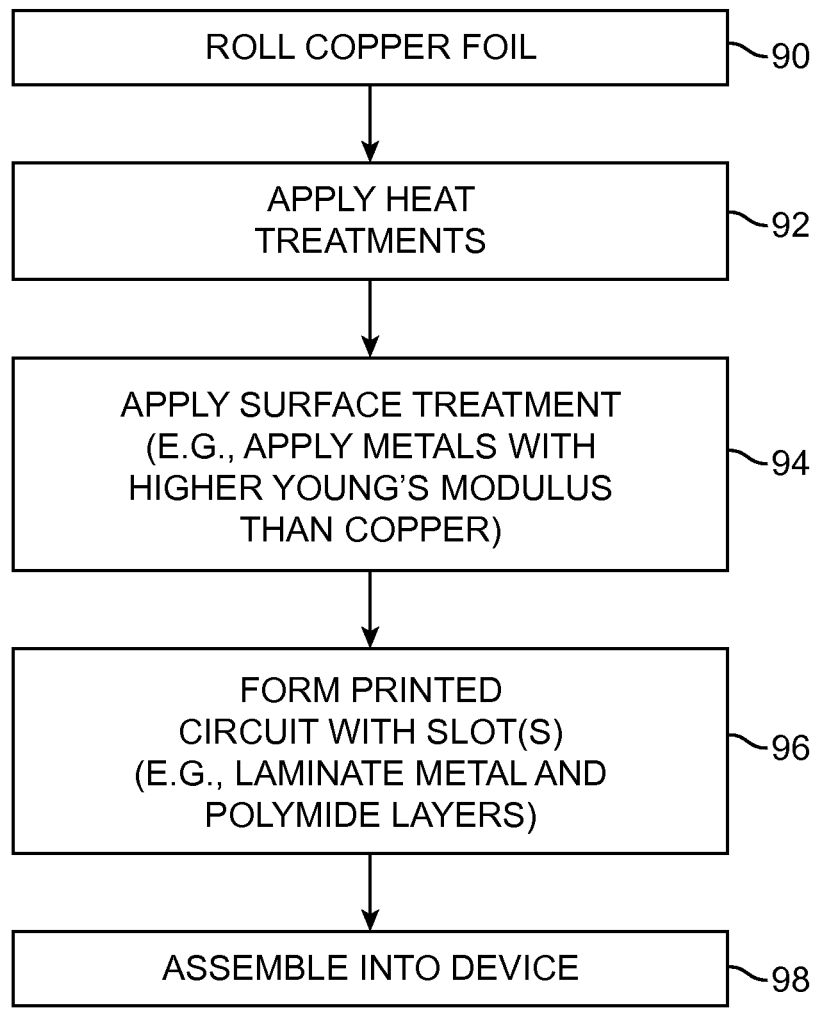
FIG. 8 is a flow chart of illustrative steps involved in forming an electronic device having printed circuits of the type shown in FIG. 7 in accordance with an embodiment.

Illustrative steps involved in forming an electronic device using a flexible printed circuit such as flexible printed circuit 50 of FIG. 7 are shown in FIG. 8. At step 90, a metal layer may be formed for core 76. As an example, a layer of copper foil may be formed by rolling copper into sheets between rollers. The rolled copper foil may be heat treated (i.e., annealed) one or more times at step 92. Following the heat treatments of step 92 to form metal core 76, both the upper and lower surfaces of core layer may be coated with appropriate crack-resistant alloys, as described in connection with FIG. 7. For example, nickel alloys, cobalt alloys, or other metals that have a higher Young's modulus than copper (and that are thereby better able than copper to resist cracking when flexed) may be coated onto the exposed upper and lower surfaces of copper core 76, thereby forming coating layers 74 and 78.

At step 96, metal layer 72 may be patterned and attached to polyimide substrate 82 (e.g., layers 82 and 72 may be laminated together and patterned using techniques such as masking and etching or other patterning techniques). Patterned coverlay 66 may then be bonded to metal layer 74 and shield layers 60A and 60B added to the upper and lower surfaces of flexible printed circuit 50.

At step 98, flexible printed circuit 50 may be assembled in housing 12 with the other components of device 10 so that flexible printed circuit 50 interconnects components in moving housing structures, as described in connection with FIG. 2.

Figure 9:
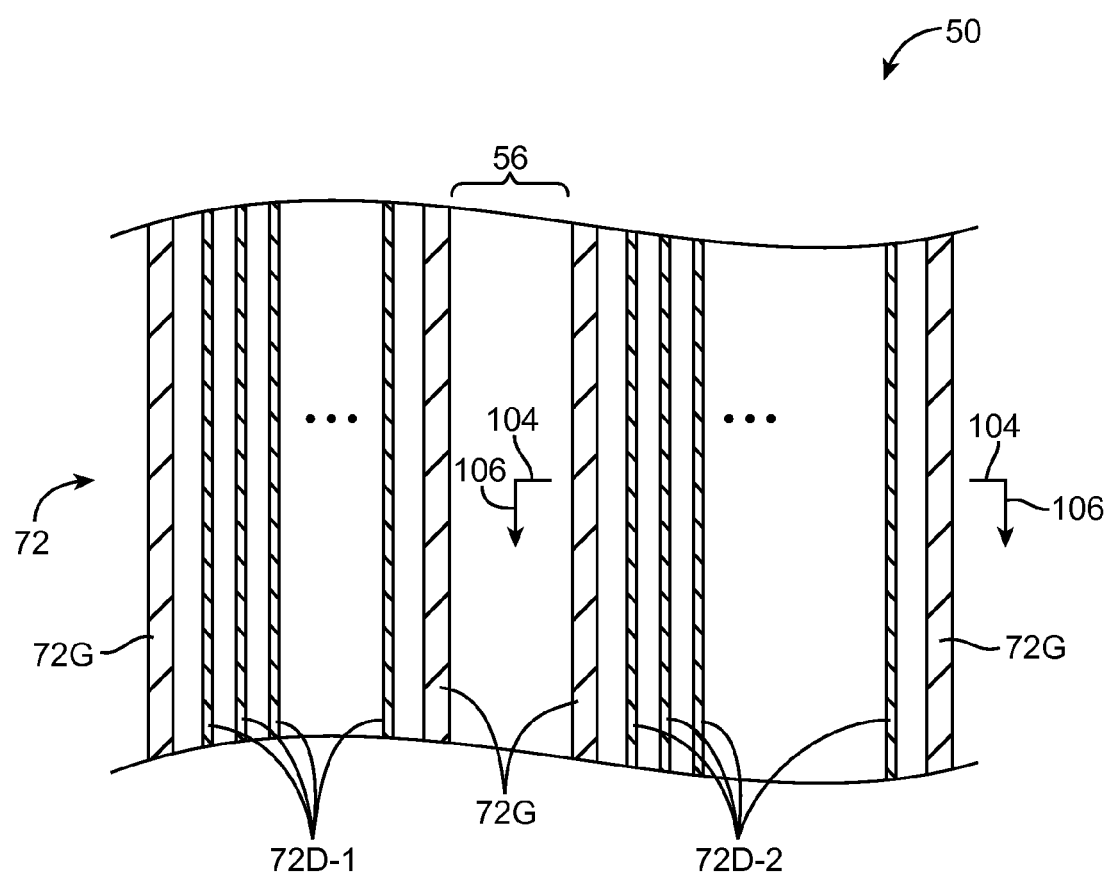
FIG. 9 is a top view of illustrative ground lines and non-ground signal lines such as analog and digital data lines in a flexible printed circuit in accordance with an embodiment.

Upper shielding layer 60A and lower shielding layer 60B may be coupled to ground. For example, upper shielding layer 60A may be shorted to ground lines within metal layer 72 through openings in coverlay 66. FIG. 9 is a top view of a portion of the metal traces that may be formed from layer 72 in printed circuit 50. As shown in FIG. 9, metal traces 72 may include ground lines (traces) 72G and non-ground signal lines (sometimes referred to as data lines, signal traces, or data traces) 72D-1 and 72D-2.

Figure 10:
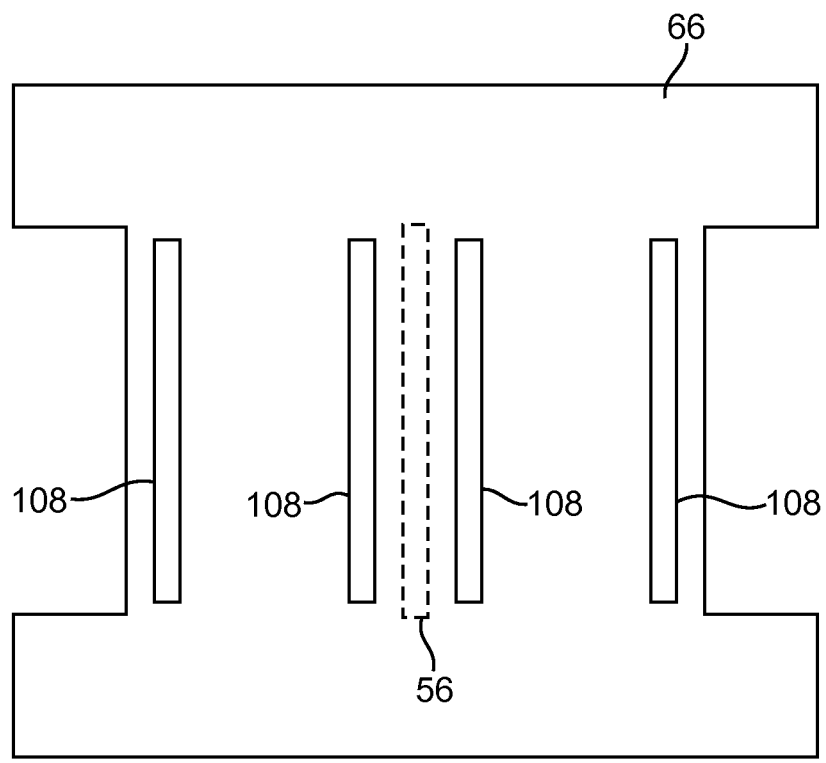
FIG. 10 is a top view of an illustrative coverlay pattern that may be used in a flexible printed circuit in accordance with an embodiment.

Slot 56 runs along the center of flexible printed circuit 50 and divides the data lines on the flexible printed circuit into two sets. Data lines 72D-1 are located on the left-hand side of slot 56 and data lines 72D-2 are located on the right-hand side of slot 56. First and second ground lines 72G run along the opposing left and right edges of data lines 72D-1, respectively. Third and fourth ground lines 72G run along the opposing left and right edges of data lines 72D-1. With this arrangement, slot 56 is bordered on its left and right edges by a pair of ground lines 72G that run along the length of flexible printed circuit 50 in parallel with the other metal traces. Each set of data lines is laterally shielded by the presence of the laterally adjacent ground lines 72G. Vertical shielding is provided by shield layers 60A and 60B. Ground lines 72G may be vertically coupled to shield layer 60A through a set of four slots 108 in coverlay 66, as shown in FIG. 10. Because the slots 108 have elongated shapes and extend along the length of flexible printed circuit 50, they are free of structures that might concentrate stresses in the flexible printed circuit and thereby help to minimize stress on metal traces 72.

Figure 11:
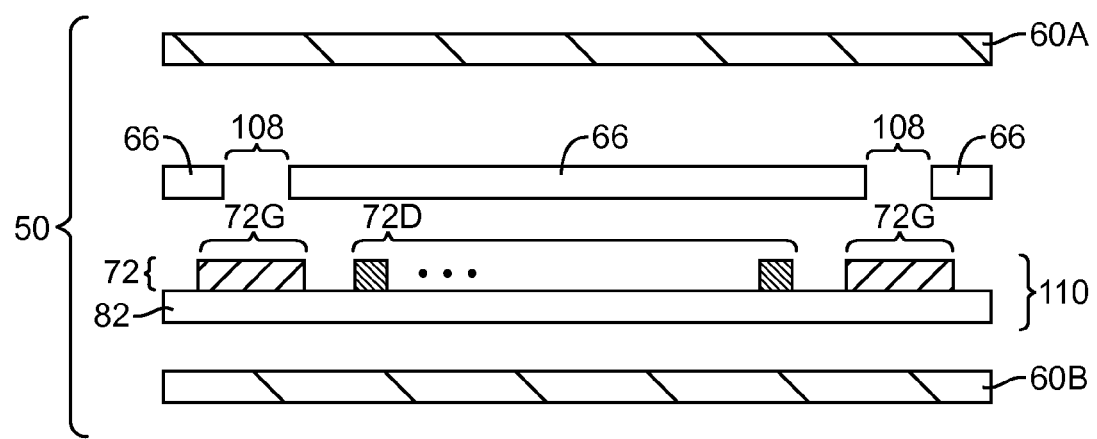
FIG. 11 is an exploded cross-sectional side view of a portion of a flexible printed circuit with metal traces of the type shown in FIG. 9 in accordance with an embodiment.

FIG. 11 is an exploded cross-sectional side view of a portion of printed circuit 50 of FIG. 9 taken along line 104 of FIG. 9 and viewed in direction 106. As shown in FIG. 11, slot (slit) openings 108 in coverlay 66 are aligned with corresponding ground lines 72G and allow ground lines 72G to be shorted to upper shield layer 60A when the layers of flexible printed circuit 50 are assembled. Layer 60B may be grounded at the ends of flexible printed circuit 50 (e.g., to ground traces in the layers of ends 50').

The foregoing is merely illustrative of the principles of this invention and various modifications can be made by those skilled in the art without departing from the scope and spirit of the invention.

What is claimed is:

1. An electronic device, comprising:
   a housing having a base and having a lid that rotates relative to the base; and
   a flexible printed circuit having a metal layer that is patterned to form metal traces including signal traces and ground traces, wherein the metal layer has first and second metal coating layers on opposing upper and lower surfaces of a metal core layer, wherein the first metal coating layer coats all of the upper surface of the metal core layer, wherein the second metal coating layer coats all of the lower surfaces of the metal core layer, and wherein the first and second metal coating layers have a higher Young's modulus than the metal core layer and prevent cracking in the metal core layer.

2. The electronic device defined in claim 1 wherein the metal core layer comprises copper.

3. The electronic device defined in claim 2 wherein the first and second metal coating layers comprise a material selected from the group consisting of: cobalt, copper, and nickel.

4. The electronic device defined in claim 3 wherein the first and second metal coating layers each have a thickness of less than 2 microns.

5. The electronic device defined in claim 4 wherein the metal core layer has a thickness of 5-20 microns.

6. The electronic device defined in claim 1 wherein the flexible printed circuit has a polymer substrate layer on which the metal layer is formed.

7. The electronic device defined in claim 6 wherein the metal layer has opposing first and second surfaces, wherein the polymer substrate layer is on the first surface and wherein the flexible printed circuit has a coverlay on the second surface.

8. The electronic device defined in claim 7 wherein the coverlay and the polymer substrate have relative thickness values that position a neutral stress plane for the flexible printed circuit within one of the first and second metal coating layers.

9. The electronic device defined in claim 7 wherein the coverlay and the polymer substrate have relative thickness values that position a neutral stress plane for the flexible printed circuit within the metal core layer.

10. The electronic device defined in claim 7 wherein the flexible printed circuit has a length, wherein the metal traces run along the length, and wherein the coverlay has slots that run along the length.

11. The electronic device defined in claim 10 wherein the slots in the coverlay are aligned with the ground traces.

12. The electronic device defined in claim 11 further comprising a metal shield layer on the coverlay, wherein the metal shield layer is shorted to the ground traces through the slots in the coverlay.

13. The electronic device defined in claim 1 wherein the flexible printed circuit has a slot that runs lengthwise along a central portion of the flexible printed circuit.

14. The electronic device defined in claim 13 wherein the signal traces include a first set of signal traces that run along a left side of the slot and a second set of signal traces that run along a right side of the slot and wherein the metal traces include a first ground trace on a left edge of the first set of signal traces, a second ground trace on a right edge of the first set of signal traces and a left side of the slot, a third ground trace on a left edge of the second set of signal traces and a right side of the slot, and a fourth ground line on a right edge of the second set of signal traces.

15. The electronic device defined in claim 14 wherein the flexible printed circuit further comprises:
    a lower metal shield layer under the metal traces;
    an upper metal shield layer above the metal traces; and
    a coverlay between the upper metal shield and the metal traces, wherein the coverlay has slots that are aligned with the first, second, third, and fourth ground traces through which the upper metal shield is shorted to the first, second, third, and fourth ground traces.

16. A flexible printed circuit, comprising:
    an upper metal shield layer;
    a lower metal shield layer;
    a polymer substrate between the upper metal shield layer and the lower metal shield layer; and
    a metal layer on the polymer substrate that is patterned to form metal traces, wherein the metal layer has first and second metal coating layers on opposing upper and lower surfaces of a metal core layer, wherein the first metal coating layer coats all of the upper surface of the metal core layer, wherein the second metal coating layer coats all of the lower surfaces of the metal core layer, wherein the metal core layer has a first Young's modulus, and wherein the first and second metal coating layers have a second Young's modulus that is greater than the first Young's modulus.

17. The flexible printed circuit defined in claim 16 wherein the metal core layer comprises copper, wherein the first and second metal coating layers comprise a material selected from the group consisting of: cobalt, copper, and nickel, and wherein the first and second metal coating layers each have a thickness of less than 2 microns, the flexible printed circuit further comprising:
    coverlay between the upper metal shield layer and the metal traces, wherein the coverlay has slots aligned with ground lines in the metal traces and wherein the flexible printed circuit has a slot that passes through the upper metal shield, the lower metal shield, the polymer substrate, the metal layer, and the coverlay.

18. An electronic device, comprising:
    a first housing structure containing first circuitry;
    a second housing structure that contains second circuitry and that moves relative to the first housing structure; and
    a flexible printed circuit that extends between the first housing structure and the second housing structure and that has metal traces that couple the first circuitry to the second circuitry, wherein the flexible printed circuit comprises:
    an upper metal shield layer;
    a lower metal shield layer;

a polymer substrate between the upper metal shield layer and the lower metal shield layer;

a metal layer on the polymer substrate that is patterned to form metal traces, wherein the metal layer has first and second metal coating layers on opposing upper and lower surfaces of a metal core layer, wherein the flexible printed circuit has a length, and wherein the metal traces run along the length; and a dielectric cover layer formed between the upper metal shield layer and the metal layer, wherein the flexible printed circuit further comprises an elongated slot in the dielectric cover layer that runs along the length, wherein the elongated slot is aligned with a ground trace, and wherein the ground trace is shorted to the upper metal shield layer through the elongated slot.

19. The electronic device defined in claim 18 wherein the metal core layer has a first Young's modulus, and wherein the first and second metal coating layers have a second Young's modulus that is greater than the first Young's modulus.

* * * * *